US010236152B2

(12) United States Patent
Zhou et al.

(10) Patent No.: US 10,236,152 B2
(45) Date of Patent: Mar. 19, 2019

(54) HIGH VOLTAGE COMPACT FUSE ASSEMBLY WITH MAGNETIC ARC DEFLECTION

(71) Applicant: EATON INTELLIGENT POWER LIMITED, Dublin (IE)

(72) Inventors: Xin Zhou, Wexford, PA (US); Robert Stephen Douglass, Wildwood, MO (US); Vincent John Saporita, Villa Ridge, MO (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/870,177

(22) Filed: Jan. 12, 2018

(65) Prior Publication Data

US 2018/0138005 A1 May 17, 2018

Related U.S. Application Data

(63) Continuation of application No. 15/388,438, filed on Dec. 22, 2016, now Pat. No. 9,899,180, which is a continuation of application No. 14/665,461, filed on Mar. 23, 2015, now Pat. No. 9,601,297.

(51) Int. Cl.

| | |
|---|---|
| ***G06F 1/16*** | (2006.01) |
| ***H05K 5/00*** | (2006.01) |
| ***H05K 7/00*** | (2006.01) |
| ***H01H 85/38*** | (2006.01) |
| ***H01F 7/02*** | (2006.01) |
| ***H01H 85/055*** | (2006.01) |
| ***H01H 85/20*** | (2006.01) |
| ***H01H 85/50*** | (2006.01) |
| *H01H 85/02* | (2006.01) |

(52) U.S. Cl.
CPC ........... *H01H 85/38* (2013.01); *H01F 7/0273* (2013.01); *H01H 85/055* (2013.01); *H01H 85/20* (2013.01); *H01H 85/202* (2013.01); *H01H 85/205* (2013.01); *H01H 85/50* (2013.01); *H01H 85/0241* (2013.01); *H01H 2085/386* (2013.01)

(58) Field of Classification Search
CPC ...... H01H 85/38; H01H 85/055; H01H 85/20; H01H 85/202; H01H 85/205; H01H 85/50; H01H 85/0241; H01F 7/0273
USPC .......................................................... 337/187
See application file for complete search history.

(56) References Cited

U.S. PATENT DOCUMENTS 4,149,216 A * 4/1979 Kussy ...................... H01H 9/10 335/6
4,514,716 A * 4/1985 Vincent De Araujo ..................... H01H 85/38 337/281
5,793,275 A * 8/1998 Iversen ................ H01H 85/055 337/273

(Continued)

*Primary Examiner* — Anthony M Haughton
(74) *Attorney, Agent, or Firm* — Armstrong Teasdale LLP

(57) ABSTRACT

Fuse assemblies in the form of fuse blocks and fuse holders include embedded permanent magnet arc suppression features that facilitate higher voltage operation of fusible circuit protection without increasing the size of the fuse assemblies. The embedded magnets apply an external magnetic field upon an overcurrent protection fuse and produce an arc deflection force to enhance arc quenching capability of the fuse without increasing its form factor.

20 Claims, 13 Drawing Sheets

(56) References Cited

U.S. PATENT DOCUMENTS

| | | | | |
|---|---|---|---|---|
| 6,809,282 | B2 * | 10/2004 | Fasano | H01H 9/443 218/148 |
| 8,334,740 | B2 * | 12/2012 | Annis | H01H 9/446 218/148 |
| 8,519,292 | B2 * | 8/2013 | Domejean | H01H 9/346 218/149 |
| 2008/0296264 | A1 * | 12/2008 | Schulz | H01H 9/443 218/26 |
| 2013/0228551 | A1 * | 9/2013 | Asokan | H01H 33/182 218/23 |

* cited by examiner

HIGH VOLTAGE COMPACT FUSE ASSEMBLY WITH MAGNETIC ARC DEFLECTION

CROSS REFERENCE TO RELATED APPLICATIONS

This application is a continuation application of U.S. application Ser. No. 15/388,438 filed Dec. 22, 2016 and now issued U.S. Pat. No. 9,899,180, which is in turn a continuation application of U.S. application Ser. No. 14/665,461 filed Mar. 23, 2015 and now issued U.S. Pat. No. 9,601,297, the disclosures of which are hereby incorporated by reference in their entirety.

BACKGROUND OF THE INVENTION

The field of the invention relates generally to circuit protection devices, and more specifically to fuse assemblies such as fuse blocks and fuse holder devices for receiving an overcurrent protection fuse.

Fuses are widely used as overcurrent protection devices to prevent costly damage to electrical circuits. Fuse terminals typically form an electrical connection between an electrical power source and an electrical component or a combination of components arranged in an electrical circuit. One or more fusible links or elements, or a fuse element assembly, is connected between the fuse terminals, so that when electrical current flowing through the fuse exceeds a predetermined limit, the fusible elements melt and open one or more circuits through the fuse to prevent electrical component damage.

In order to complete electrical connections to external circuits, a variety of fuse blocks and fuse holders have been made available that define fuse receptacles or compartments to receive overcurrent protection fuses and are provided with line and load-side fuse contact members to establish electrical connection through the fusible elements in the fuse.

In view of trends in electrical power systems to operate at increasingly greater system voltages, and also in view of industry preferences to maintain a size form factor equal to or smaller than existing fuse blocks and fuse holders, known fuse blocks and fuse holders are disadvantaged in some aspects and improvements are desired.

BRIEF DESCRIPTION OF THE DRAWINGS

Non-limiting and non-exhaustive embodiments are described with reference to the following Figures, wherein like reference numerals refer to like parts throughout the various views unless otherwise specified.

DETAILED DESCRIPTION OF THE INVENTION

Figure 1:
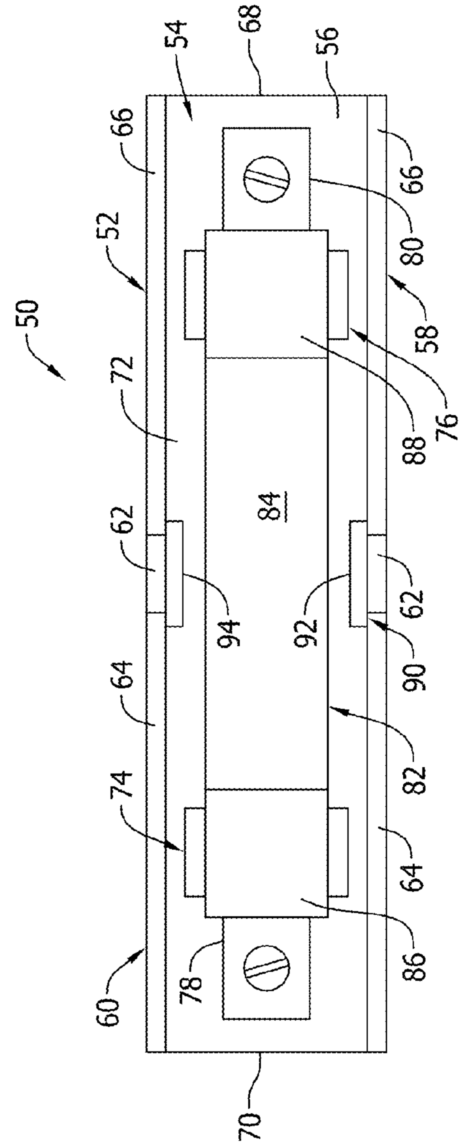
FIG. 1 is top view of an exemplary fuse assembly including a fuse block equipped with a first magnetic arc suppression system according to an exemplary embodiment of the present invention.

As system voltages continue to increase in various industrial sectors such as renewable energy, data centers, and in the mining industry to name a few, practical challenges are presented to circuit protection manufacturers generally and to overcurrent protection fuse manufacturers specifically. Among the challenges presented is an increased desire in the market to provide fuses and fuse assemblies with increased performance capabilities while maintaining or reducing an existing form factor (i.e. size) of fuses and fuse assemblies.

For example, in state of the art photovoltaic (PV) applications the operating electrical system voltage is being increased from 600 VDC to 1000 VDC, and in some cases to 1500 VDC. Operation of overcurrent fuses to interrupt circuitry at such increased system voltages while maintaining the form factor of existing fuses and fuse assemblies in a conventional manner is inadequate because electrical arc energy experienced within the fuse is much more severe than in the lower voltage systems for which fuses and fuse assemblies having existing form factors were designed. Effectively containing and dissipating the increased amount of arc energy without enlarging the size of the fuse or fuse assembly presents practical challenges beyond the capability of existing and conventional fuses and fuse assemblies.

One possible approach to addressing increased arc energy issues at higher system voltage, but within the form factor constraints of existing fuses, is to provide additional areas of reduced cross sectional area, often referred to as "weak spots", in the fuse element construction. Electrical arcing, which occurs at the locations of the weak spots in short circuit conditions, can therefore be divided over a greater number of weak spots with lower arc voltages at each location to limit and interrupt the fault current. There are practical limitations, however, as to how many weak spots can be designed into a fuse element and hence expanding the number of weak spots is not an effective solution to achieve satisfactory fuse operation in response to short circuit conditions at higher system voltages of 1000 VDC or 1500 VDC.

For fuses designed to respond to electrical overload conditions, accommodating increased arc energy presents still further challenges that are not effectively resolved in existing fuse assemblies.

Exemplary embodiments of fuse assemblies such as fuse holders and fuse blocks are described hereinbelow that address the above problems in the art and facilitate higher power operation of overcurrent protection fuses without increasing the form factor from present levels. The fuse holders and fuse blocks achieve higher voltage operation in a compact size via the provision of a permanent magnet arc deflection system. The permanent magnet arc deflection system generates an external magnetic field across the body of the fuse when received in the fuse block or the fuse holder. The fusible element inside the body of the fuse is therefore subjected to the external magnetic field that combines with an internal magnetic field produced by electrical current flowing through the fuse. The combined external and internal magnetic fields produce a mechanical force in response that, in turn, causes the electrical arc to deflect or bend inside the fuse body as the fuse element operates or opens to interrupt the circuit. This increase the cooling of the arc. Enhanced arc suppression is therefore possible without altering the fuse construction.

More specifically, the bending and deflection of the electrical arc can be directed to extend electrical arcing into cooler arc extinguishing material than if the arc was not deflected or caused to bend, and consequently fuses of the same physical size can be operated at much higher voltages in fuse blocks and fuse holders also having the same physical size and form factor of existing fuse blocks and fuse holders. The magnets can be easily applied to a fuse holder or fuse block in a low cost manner without increasing the form factor of the fuse holder or fuse block either. Method aspects will be in part apparent and in part explicitly discussed in the description below.

FIG. 1 is top view of an exemplary fuse assembly 50 in the form of a fuse block 52 including an electrically non-conductive housing 54 formed with a base wall 56 and upstanding side walls 58, 60 extending from opposed longitudinal edges of the base wall 56. The side walls 58, 60 extend generally parallel to one another and include a centrally located cutout portion 62 and barrier portions 64, 66 extending on each side thereof to end respective end edges 68, 70 of the base wall 56. The side walls 58, 60 in combination with the base wall 56 define a fuse receptacle 72 extending above the base wall 56 and between the side walls 58, 60. The fuse receptacle 72 is generally elongated and is open and accessible from the top as shown in FIG. 1 and also is open and accessible from end edges 68, 70. As such, the fuse block 52 may be recognized as an open style fuse block.

The base wall 56 is provided with a set of fuse contact terminals in the form of a first fuse contact terminal 74 on one side of the fuse receptacle 72 near the end edge 70 and a second fuse contact terminal 76 on another side of the fuse receptacle 72 near the end edge 68. Line and load side terminals 78, 80 are also provided adjacent the fuse contact terminals 74, 76 and are configured for connection to external line and load-side circuitry. In contemplated embodiments, the fuse contact terminals 74, 76 are configured as resilient fuse clips, and the line and load-side terminals 78, 80 are configured to receive a stripped end of a respective wire and secured in place with a screw clamp arrangement as shown. A variety of alternative terminal structures and configurations are known and may be utilized in further and/or alternative embodiments.

A removable overcurrent protection fuse 82 may be received in the fuse receptacle 72 between the side walls 58, 60 as shown. In the illustrated example, the overcurrent protection fuse 82 includes an elongated and generally cylindrical housing 84 fabricated from an electrically non-conductive material, and conductive fuse terminal elements in the form of end caps or ferrules 86, 88. Internal to the fuse housing 84 is a fusible element (not shown in FIG. 1 but described further below) that is fabricated from an electrically conductive material and that is connected to and defines a current path between the fuse terminal elements 86, 88 and by implication completes the circuit between the line and load-side terminals 78, 80 when the fuse 82 is received in the fuse receptacle 72 with the respective end caps or ferrules 86, 88 engaged with the fuse contact terminals 74, 76.

In contemplated embodiments, the fusible element may include a short circuit element and/or an overload fuse element that is calibrated to melt, disintegrate or otherwise structurally fail to conduct current in response to specified overcurrent conditions. The structural failure of the fusible element creates an open circuit between the fuse terminal elements 86, 88 but otherwise withstands other electrical current conditions. This operation of the fusible element from an intact, current carrying state to a non-current carrying state or open state, desirably electrically isolates load-side circuitry connected through the fuse 82 and protects the load-side circuit from damage that may otherwise result from overcurrent conditions. Once the fuse 82 operates to open or interrupt the circuit between the line and load-side terminals 78, 80 it must be replaced to restore the connection between the line and load-side terminal 78, 80 and the associated line and load-side circuitry.

An increase in system voltage from 600 VDC to 1000 VDC or 1500 VDC results in a substantial increase of arc voltage to in electrical arcing conditions within the fuse housing 84 as the fusible element opens. Effectively suppressing electrical arcing as the fuse operates is a primary limitation to providing fusible circuit protection for higher voltage circuitry while maintaining the same form factor (e.g., physical size and dimension) of the fuse 82 as existing fuses designed for lower voltage systems, as well as maintaining the same form factor of the fuse block 52 as fuse blocks designed for lower voltage systems. Unfortunately, conventional fuse blocks and conventional fuses are not equipped to solve the problems associated with increased arc intensity.

To more effectively address electrical arc interruption issues associated with higher voltage operation, the fuse block 52 is equipped with a magnetic arc suppression system including embedded magnet structure as further explained in the examples below.

Figure 2:
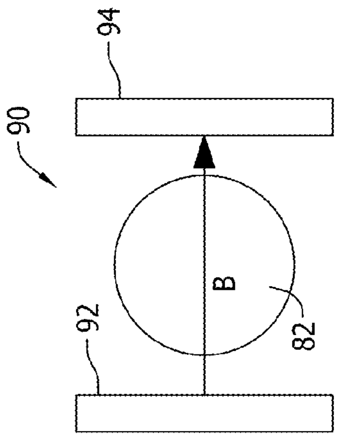
FIG. 2 is a partial end elevational view of the fuse block shown in FIG. 1 illustrating a first fuse and magnet assembly configuration.

According to the example of FIG. 1, a portion of which is also shown in FIG. 2, the magnetic arc suppression system 90 includes a first permanent magnet 92 extending along the side wall 58 of the fuse block housing 54 and a second permanent magnet 94 extending along the side wall 60 of the fuse block housing 54. The permanent magnets 92, 94 are spaced apart but extend parallel to one another alongside and on opposing lateral sides of the fuse 82, and more specifically the center portion of the fuse housing 84 extends in between the permanent magnets 92, 94. As such, the permanent magnets 92, 94 are diametrically opposed on either lateral side of the fuse 82 and impose a magnetic field B (FIG. 2) between the magnets 92, 94 and also extending transversely across the fuse receptacle 72. The magnetic field B generated between the magnets 92, 94 acts upon an electrical arc (or electrical arcs) inside the fuse housing 84 as the fusible element operates as further explained below. The transverse magnetic field B deflects and stretches electrical arcs as they occur so that they can be more effectively quenched.

The permanent magnets 92 and 94 may be attached to the housing side walls 58, 60 or otherwise mounted to the housing 54 in any manner desired. While two magnets 92, 94 are shown in FIGS. 1 and 2, it is understood that additional permanent magnets may be provided with similar effect. The magnets 92, 94 are shown in approximately centered positions between the end edges 68, 70 of the housing 54 and therefore are also approximately centered with respect to the fuse 82. Other arrangements of magnets are possible, however, and may be utilized so long as magnetic fields can be directed transversely to corresponding locations of the electrical arc in the fuse as it operates. It is understood that the location of the electrical arc can be determined by the geometry and configuration of the fusible elements included in the fuses 82.

Figure 3:
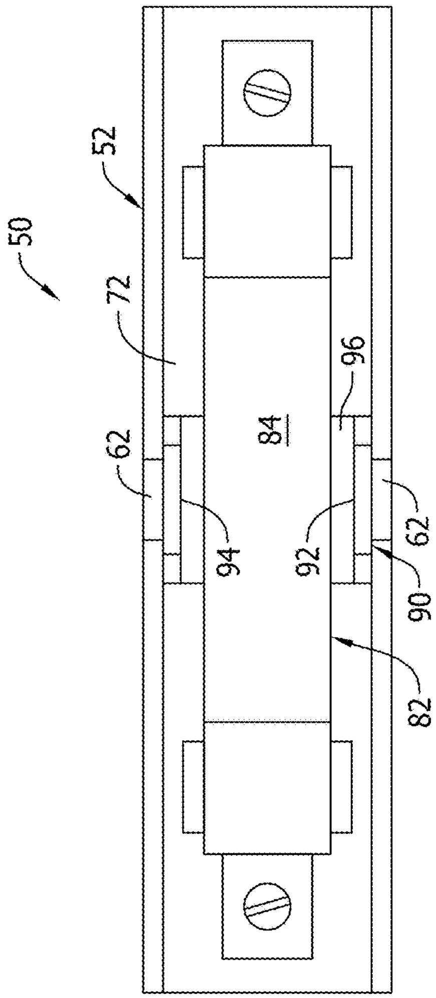
FIG. 3 is top view of another exemplary fuse assembly including a fuse block equipped with a second magnetic arc suppression system according to an exemplary embodiment of the present invention.
Figure 4:
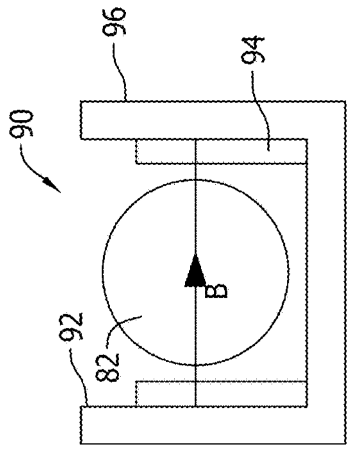
FIG. 4 is a partial end elevational view of the fuse block shown in FIG. 3 illustrating a second fuse and magnet assembly configuration.

FIG. 3 is top view of an exemplary fuse assembly 50 including the fuse block 52, wherein the magnetic arc suppression system 90 (shown in end view in FIG. 4) includes the first and second permanent magnets 92 and 94, and a U-shaped ferromagnetic plate 96 that extends not only along the lateral sidewalls 58, 60 of the fuse block housing 54, but also beneath the fuse 82 as seen in FIGS. 3 and 4. The ferromagnetic plate 96 may be fabricated from steel in one example and may facilitate the mounting of the magnets 94 and 96 in the fuse receptacle 72, as well as improve the effect of the transverse magnetic field produced between the magnets 92 and 94 to deflect and suppress the electrical arc in the fuse 82 as it occurs.

While one ferromagnetic plate 96 is shown in FIGS. 1 and 2 having a particular shape, it is recognized that more than one ferromagnetic plate 96 may alternatively be provided proximate each magnet 92 and 94. It is also contemplated that in an embodiment having additional magnets, additional ferromagnetic plates could be provided. Wherever utilized, the ferromagnetic plates may function to increase the magnetic field intensity beyond the value provided by the magnets themselves, or to reduce the size and strength of the magnets utilized while still generating a magnetic field of a desired strength.

Figure 5:
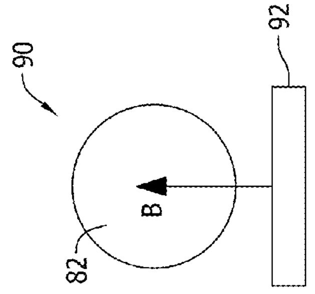
FIG. 5 is a partial end elevational view of a third fuse and magnet assembly configuration for a fuse block according to the present invention.

FIG. 5 is an end view of another configuration of the magnetic arc suppression system 90 including only one permanent magnet 92 positioned beneath the fuse 82. The magnet 92 may be mounted, for example, on the base wall 56 of the fuse block housing 54 and when the fuse 82 is received in the fuse block 54 the fuse 82 overlies and substantially covers the magnet 92. The magnetic arc suppression system 90 shown including the single magnet 92 establishes, in the orientation shown in FIG. 5, a magnetic field B extending upwardly or vertically rather than horizontally as in the arrangements shown in FIGS. 2 and 4. That is, in the arrangement of FIG. 5, the magnetic field is established in a direction parallel to the side walls 58, 60 of the fuse block housing 54 rather than perpendicular to the side walls 58, 60 as in the arrangements of FIGS. 2 and 4. It should be realized, however, that if desired a single magnet may nonetheless generate a transverse magnetic field by placing the magnet 92 on the lateral side of the fuse 82 instead of beneath the fuse 82 as shown in FIG. 4.

Figure 6:
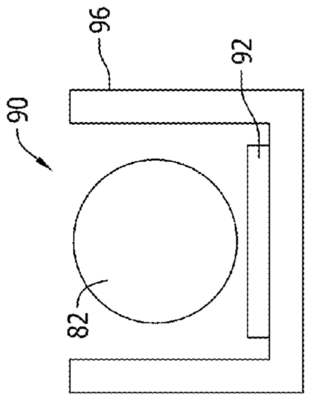
FIG. 6 is a partial end elevational view of a fourth fuse and magnet assembly configuration for a fuse block according to the present invention.

FIG. 6 is an end view of another configuration of the magnetic arc suppression system 90 including the single magnet 92 in combination with the ferromagnetic plate 96. In the example of FIG. 5, the single magnet 92 is located on the bottom of the U-shaped ferromagnetic plate 96 and the fuse 82 is also located interior to the U-shaped plate 96 for improved magnetic effect to suppress electrical arcing inside the fuse 82. As discussed above, more than one ferromagnetic plate and also ferromagnetic plates of different shapes and configurations may utilized in further and/or alternative embodiments to produce similar effects.

Figure 7:
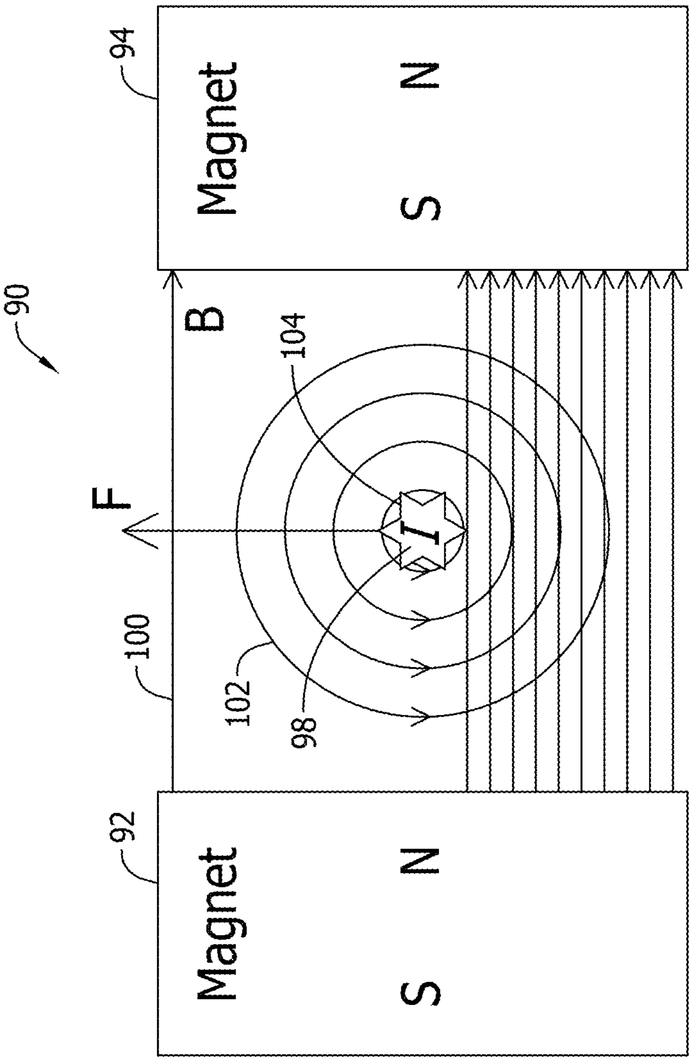
FIG. 7 is a schematic view of a magnetic arc suppression system according to the present invention and illustrating principles of operation thereof.

FIG. 7 is a schematic view of the magnetic arc suppression system 90 that provides magnetic arc deflection and enhances performance capability of the fuses 82 in, for example, DC power systems operating at 1000 VDC or 1500 VDC. The magnetic arc suppression system 90 assists in quickly and effectively dissipating an increased amount of arc energy associated with electrical arcing, generating an arc voltage that is higher than 1000 VDC or 1500 VDC to interrupt the circuit as each fuse 82 operates. Using the principles of the magnetic arc suppression system 90 described below, fuse blocks and fuse holders such as those described further below may be realized that may safely and reliably operate in electrical power systems operating at 1000 VDC or greater. The interrupting capability of the fuse 82 accordingly may greatly increase via the implementation of the magnetic arc suppression system 90. Because the magnetic arc suppression system 90 is provided externally from the fuse 82, enhanced performance capabilities may be achieved without modifying the fuse or its form factor and also without increasing the form factor of the fuse blocks or fuse holders.

As seen in FIG. 7, the magnetic arc suppression system 90 includes a pair of permanent magnets 92, 94 arranged on each side of a conductor 98 that may correspond to a fuse element in the fuse 82 described above. In contemplated embodiments, each magnet 92, 94 is a permanent magnet that respectively imposes a magnetic field 100 having a first polarity between the pair of magnets 92, 94, and the conductor 98 is situated in the magnetic field 100. As shown in FIG. 7, the magnet 92 has opposing poles S and N and the magnet 94 also has opposing poles S and N. Between the pole N of magnet 92 and the pole S of magnet 94 the magnetic field B (also indicated as element 100) is established and generally oriented in the direction extending from the magnet 92 to the magnet 94 as shown (i.e., from left to right in the drawing of FIG. 7). The magnetic field B has a strength dependent on the properties and spacing of the magnets 92 and 94. The magnetic field B may be established in a desired strength depending on the magnets 92 and 94 utilized. As noted above, the magnetic field B can be established by a single magnet instead of a pair of magnets. In contemplated embodiments, the strength of the magnetic field B should preferably be higher than about 30 mT, although higher and lower limits are possible and may be utilized in other embodiments.

When electrical current I flows through the conductor 98 in a direction normal to the plane of the page of FIG. 7 and more specifically in a direction flowing out of the plane of the page of FIG. 7, a separate magnetic field 102 is induced and as shown in FIG. 7 the magnetic field 102 extends circumferentially around the conductor 98. The strength or intensity of the magnetic field 102 is, however, dependent on the magnitude of the current flowing through the conductor 98. The greater the current magnitude I, the greater the strength of the magnetic field 102 that is induced. Likewise, when no current flows through the conductor 98, no magnetic field 102 is established.

Above the conductor 98 in the example illustrated in FIG. 7, the magnetic field 100 and the magnetic field 102 generally oppose one another and at least partly cancel one another, while below the conductor 98 as shown in FIG. 7, the magnetic field 100 and the magnetic field 102 combine to create a magnetic field of increased strength and density. The concentrated magnetic field resulting from the combination of the magnetic fields 102, 104 beneath the conductor 98 produces a mechanical force F acting on the conductor 98. The force F extends upward or generally vertically in the drawing of FIG. 7 that is, in turn, directed normal to the magnetic field B 100. The force F may be recognized as a Lorenz force having magnitude F determined by the following relationship:

$$F=IL\times B \tag{1}$$

It should now be evident that the magnitude of the force F can be varied by applying different magnetic fields, different amounts of current, and different lengths (L) of conductor 98. The orientation of the force F is shown to extend in the vertical direction in the plane of the page of FIG. 7, but in general can be oriented in any direction desired according to Fleming's Left Hand Rule, a known mnemonic in the field.

Briefly, Fleming's Left Hand Rule illustrates that when current flows in a wire (e.g., the conductor 98) and when an external magnetic field (e.g., the magnetic field B illustrated by lines 100) is applied across that flow of current, the wire experiences a force (e.g., the force F) that is oriented perpendicularly both to the magnetic field and also to the direction of the current flow. As such, the left hand can be held so as to represent three mutually orthogonal axes on the thumb, first finger and middle finger. Each finger represents one of the current I, the magnetic field B and the force F generated in response. As one illustrative example, and considering the example shown in FIG. 7, the first finger may represent the direction of the magnetic field B (e.g., to the right in FIG. 7), the middle finger may represent the direction of flow of the current I (e.g., out of the page in FIG. 7), and the thumb represents the force F. Therefore, when the first finger of the left hand is pointed to the right and the middle finger is oriented out of the page in FIG. 7, the position of the thumb reveals that the force F that results is pointed in the vertical direction shown (i.e., toward the top of the page in FIG. 7).

By orienting the current flow I in different directions through the magnetic field B, and also by orienting the magnetic field B in different directions, forces F extending in directions other than the vertical direction can be generated. Within the fuse receptacle 72 of the fuse blocks described above, magnetic forces F can accordingly be directed in particular directions. For example, and according to Fleming's Left Hand Rule, if the current flow I was directed into the paper instead of out of the paper as previously described in relation to the FIG. 7 while keeping the magnetic field B oriented as shown in FIG. 7 (i.e., toward the right in FIG. 7), the force F generated would be oriented in a direction opposite to that shown (i.e., in a direction toward the bottom of the page in FIG. 7). Likewise, if the magnetic field B was oriented vertically instead of horizontally as illustrated in FIG. 7 (e.g., as in the arrangements shown in FIGS. 5 and 5, forces F could be generated in horizontal directions according to Fleming's Left Hand Rule instead of the vertically oriented forces of the preceding examples. As such, by varying the orientation of the magnets and direction of current flow, forces F can be generated that extend transversely to the axis of the fuse receptacles 72 and associated fuses 82, or forces F can be generated that extend axially or longitudinally in the fuse receptacles upon associated fuses 82. Alternatively stated, the force F can be generally to extend laterally or longitudinally with respect to the longitudinal axis of the fuse 82. Regardless, when the conductor 98 corresponds to a location of an electrical arc when the fuse element operates, the force F can deflect the electrical arc 104 when it occurs and considerably reduce arcing time and severity.

In further embodiments, the force F can be applied to the conductor 98 of the fuse 82 to provide different effects. That is, multi-directional arc deflecting configurations are possible having forces F acting in various different directions relative to the conductor 98 of the fuse. Forces F may be generated in axial and radial directions relative to a fuse 82, as well as planer and edge deflection configurations depending on the placement of the magnets 92, 94 to produce magnetic fields and forces in the directions desired to accomplish such arc deflecting configurations. In a multiple pole fuse holder defining multiple fuse receptacles or compartments, multiple sets of magnets may be provided to provide the same or different arc deflection configurations for each respective fuse in each compartment.

In certain contemplated embodiments, parallel fuses and fuse holders can mutually share a single magnet place between them to establish magnetic fields in different fuse compartments or receptacles. For example, the arrangement of magnets and fuses set forth below may be utilized S/N Fuse S/N Fuse S/N Fuse S/N wherein S/N represents the south and north pole of a respective magnet and in which the middle magnets function as a south pole for a first magnetic field acting upon a first fuse situated on a first side of the magnet and simultaneously function as a north pole for a second magnetic field acting upon a second fuse situated on the opposite side. This effect may be accomplished in a multiple pole fuse holder or in single pole fuse holders that are placed side by side.

Figure 8:
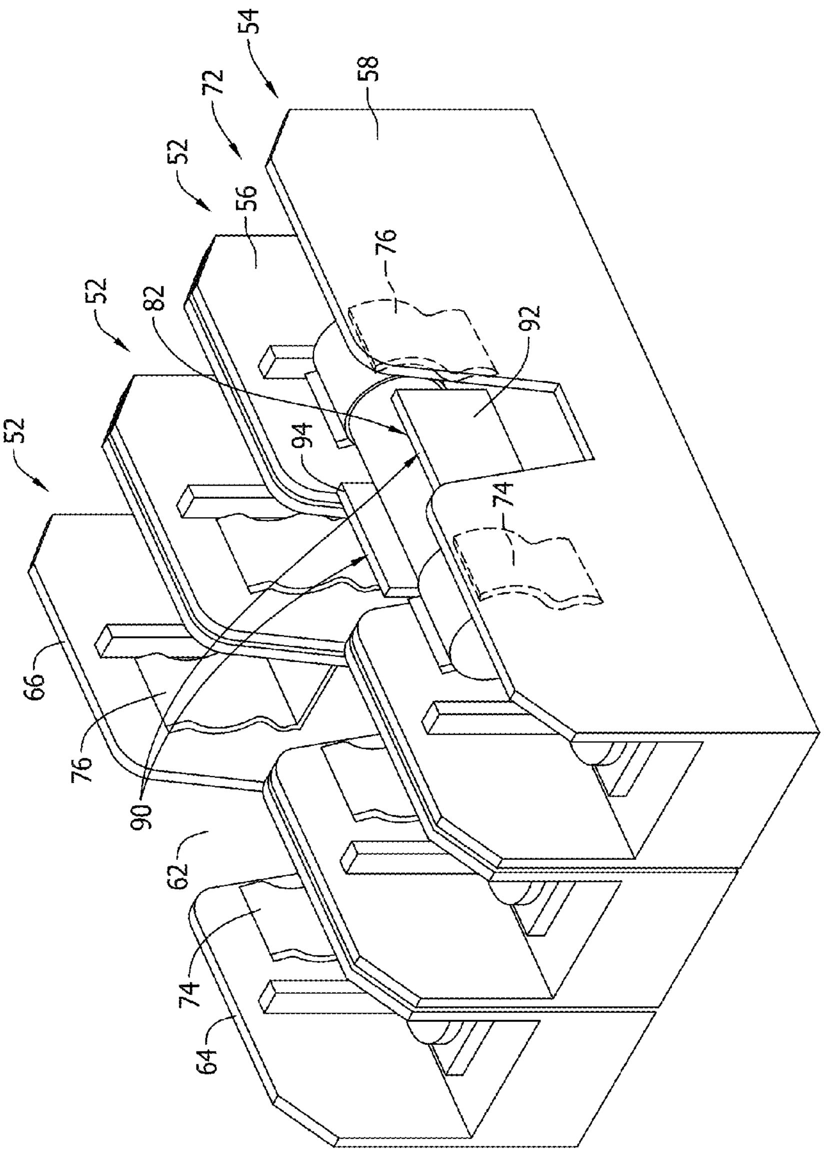
FIG. 8 is a perspective view of another embodiment of a fuse block incorporating the first fuse and magnet assembly configuration shown in FIG. 2.

FIG. 8 is a perspective view of the fuse block 52 incorporating the first fuse and magnet assembly configuration shown in FIGS. 1 and 2. Additional fuse blocks 52 may be provided side-by-side as shown to form a three-pole fuse block. While the magnetic arc suppression system 90 is shown only in the first fuse block shown in FIG. 8, it shall be understood to be present in the other fuse blocks as well. The fuse blocks 52 can be provided as modules that can be ganged together as desired. Alternatively, a multi-pole fuse block may be provided that is formed with a single housing and multiple sets of fuse contact members and line and load side terminals.

Figure 9:
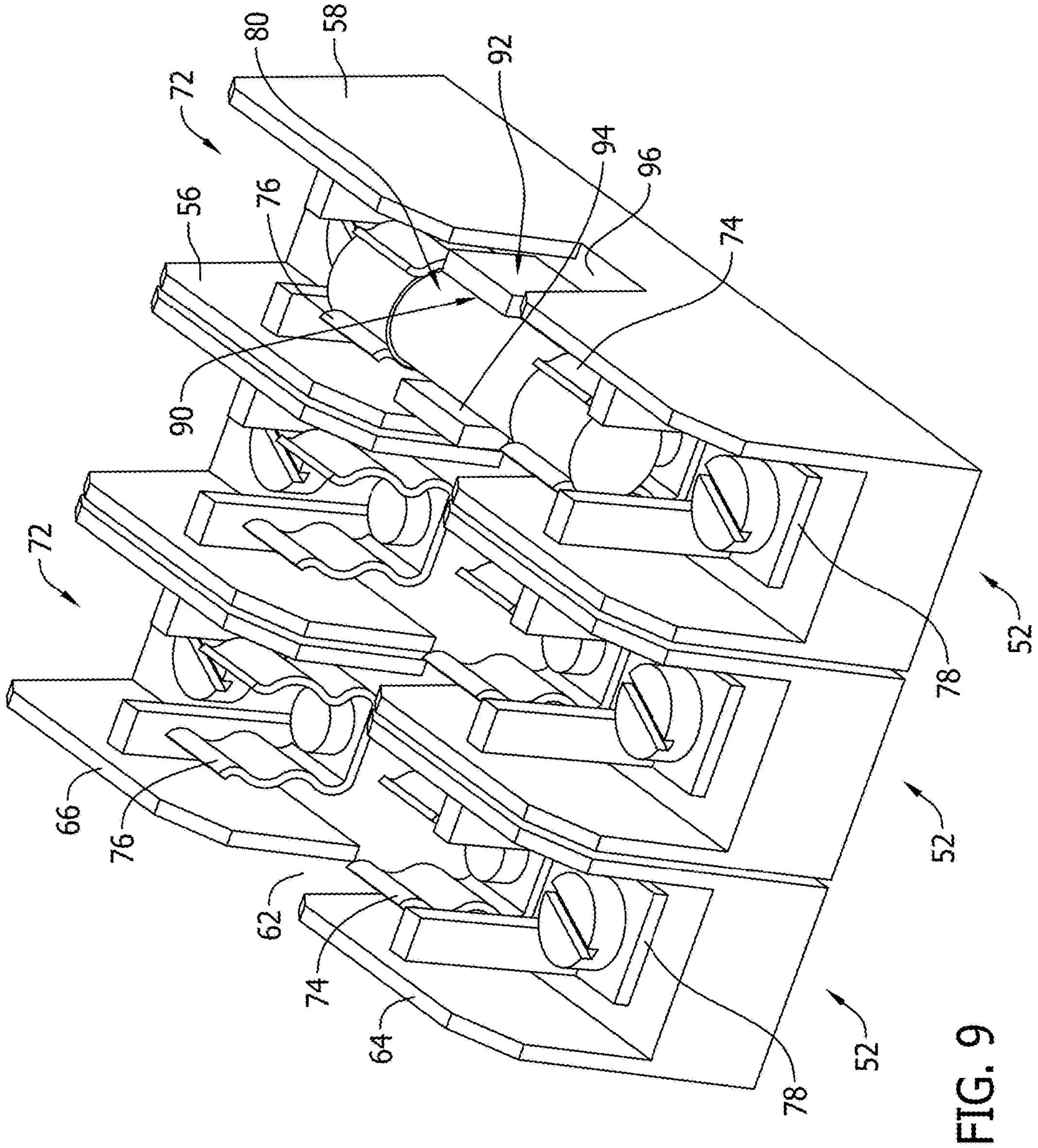
FIG. 9 is a perspective view of another embodiment of a fuse block incorporating the second fuse and magnet assembly configuration shown in FIG. 4.

FIG. 9 is a perspective view of the fuse block 52 incorporating the first fuse and magnet assembly configuration shown in FIGS. 3 and 4. Additional fuse blocks 52 may be provided side-by-side as shown to form a three-pole fuse block. While the magnetic arc suppression system 90 is shown only in the first fuse block shown in FIG. 9 it shall be understood to be present in the other fuse blocks as well. The fuse blocks 52 can be provided as modules that can be ganged together as desired. Alternatively, a multi-pole fuse block may be provided that is formed with a single housing and multiple sets of fuse contact members and line and load side terminals.

Figure 10:
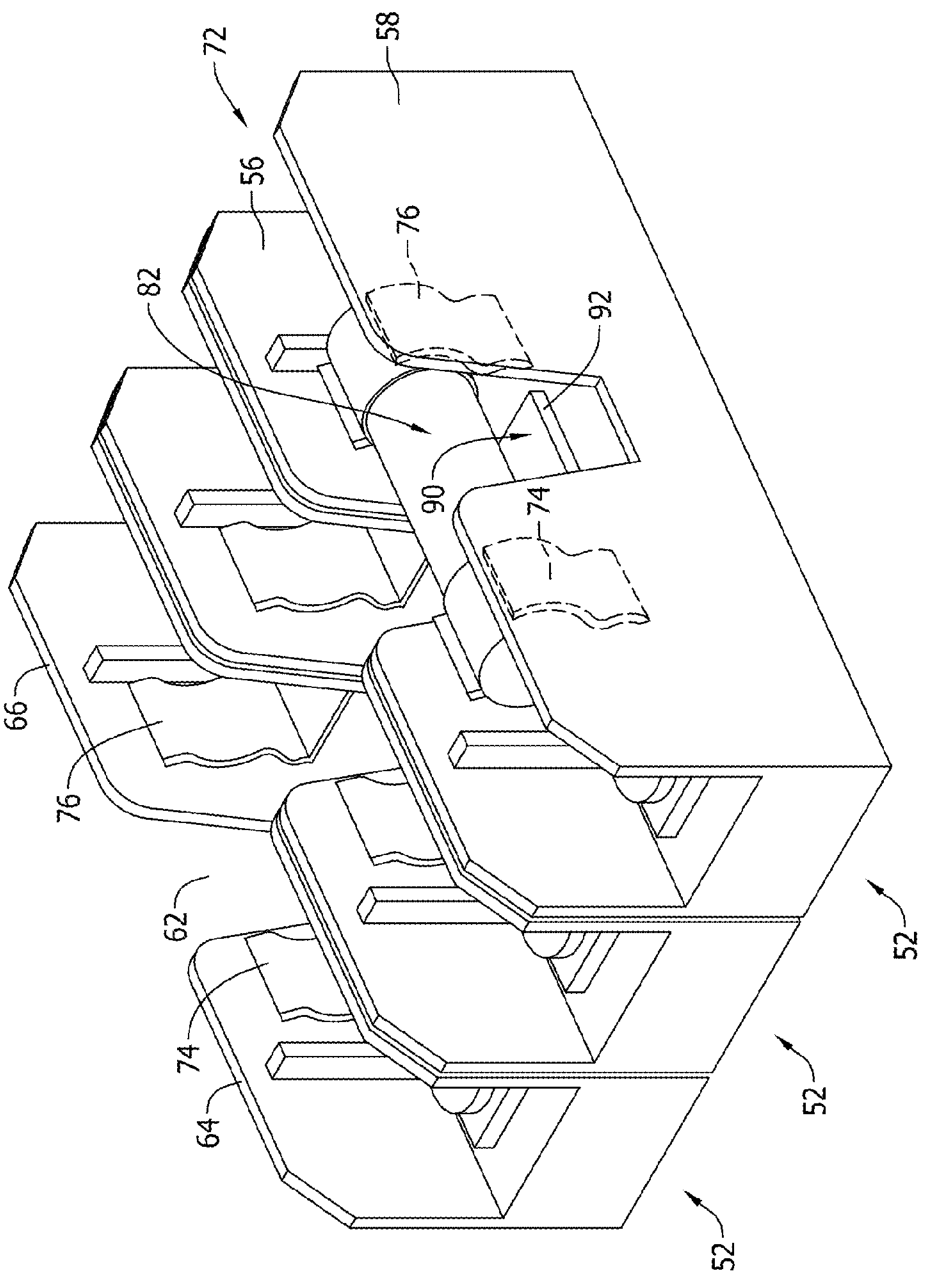
FIG. 10 is a perspective view of another embodiment of a fuse block incorporating the third fuse and magnet assembly configuration shown in FIG. 5.

FIG. 10 is a perspective view of the fuse block 52 incorporating the first fuse and magnet assembly configuration shown in FIG. 5. Additional fuse blocks 52 may be provided side-by-side as shown to form a three-pole fuse block. While the magnetic arc suppression system 90 is shown only in the first fuse block shown in FIG. 10 it shall be understood to be present in the other fuse blocks as well. The fuse blocks 52 can be provided as modules that can be ganged together as desired. Alternatively, a multi-pole fuse block may be provided that is formed with a single housing and multiple sets of fuse contact members and line and load side terminals.

Figure 11:
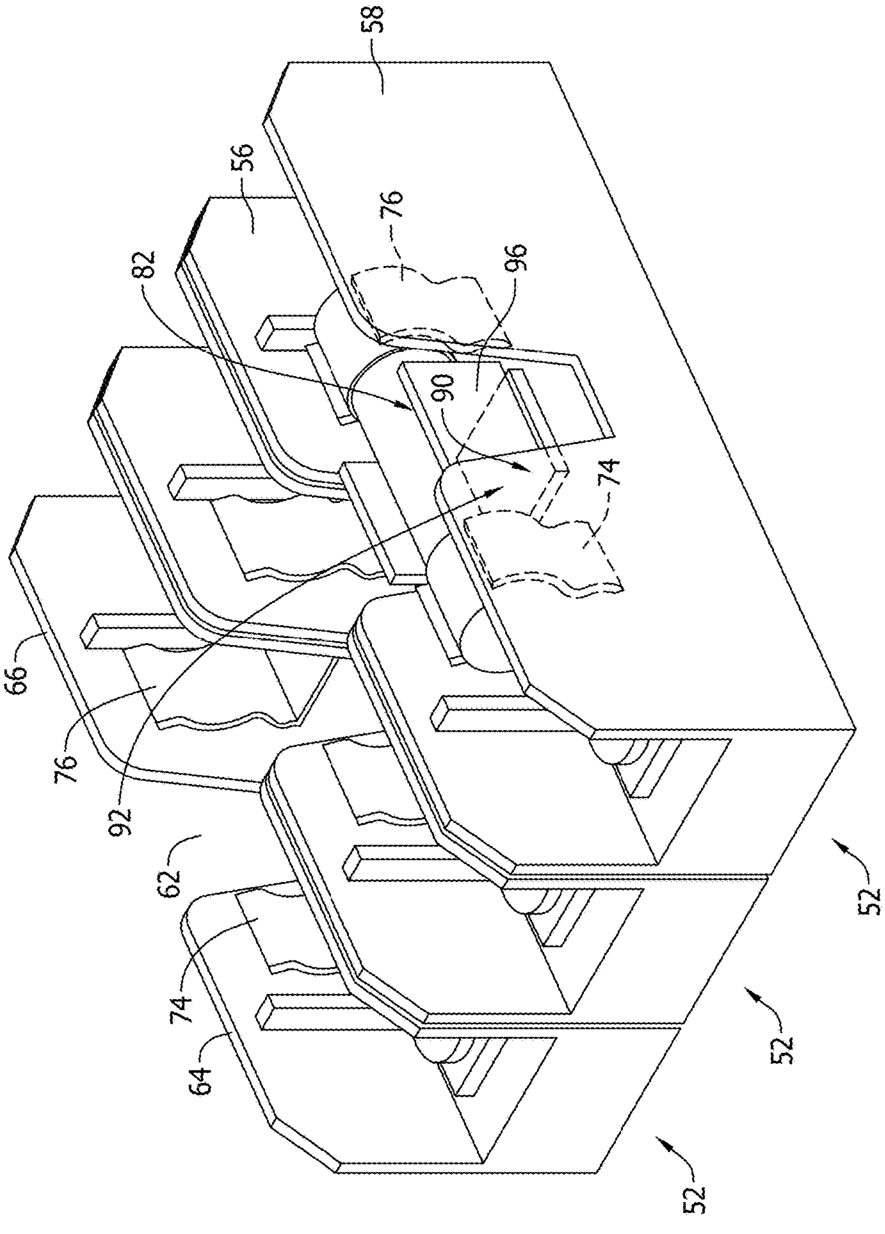
FIG. 11 is a perspective view of another embodiment of a fuse block incorporating the fourth fuse and magnet assembly configuration shown in FIG. 6.

FIG. 11 is a perspective view of the fuse block 52 incorporating the first fuse and magnet assembly configuration shown in FIG. 6. Additional fuse blocks 52 may be provided side-by-side as shown to form a three-pole fuse block. While the magnetic arc suppression system 90 is shown only in the first fuse block shown in FIG. 11 it shall be understood to be present in the other fuse blocks as well. The fuse blocks 52 can be provided as modules that can be ganged together as desired. Alternatively, a multi-pole fuse block may be provided that is formed with a single housing and multiple sets of fuse contact members and line and load side terminals.

Figure 12:
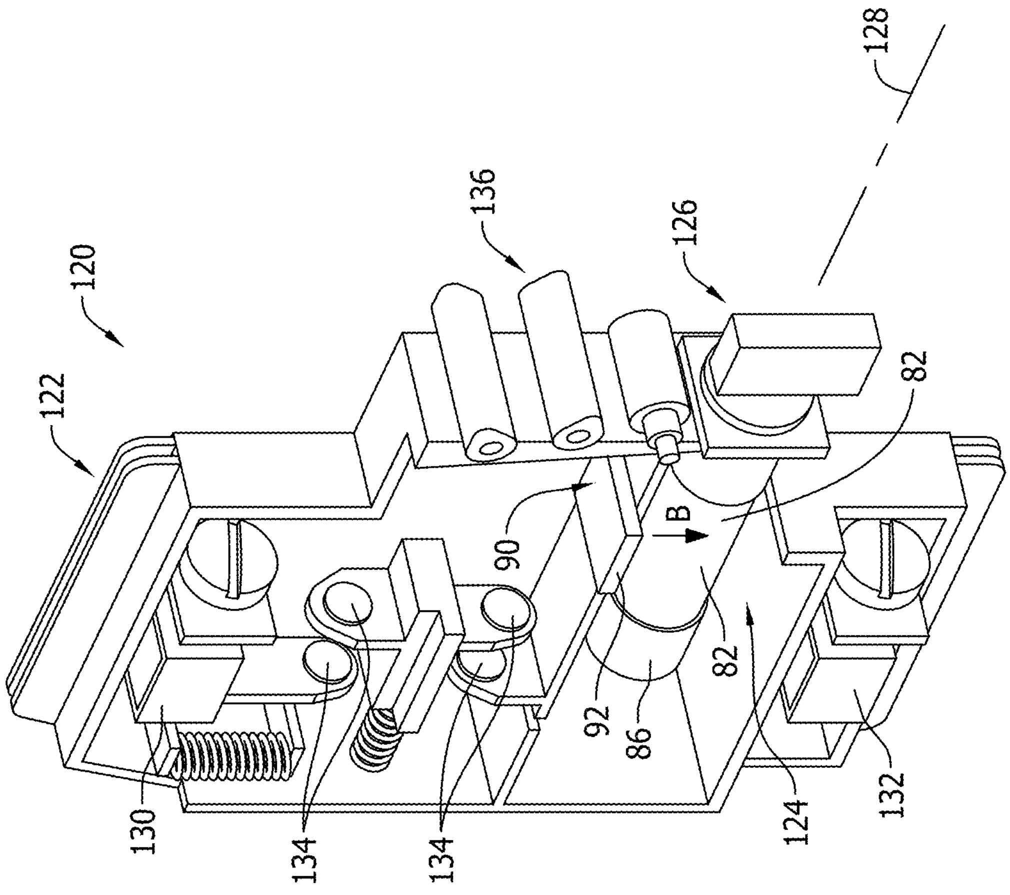
FIG. 12 is a perspective view of a first embodiment of an exemplary fuse holder including a magnetic arc suppression system according to the present invention.

FIG. 12 is a perspective view of an exemplary fuse assembly in the form of a fuse holder 120. The fuse holder 120 includes an electrically nonconductive housing 122 formed as a split shell casing (only one of which is shown in FIG. 12). When assembled, the split shell casing collectively surrounds and encloses the components shown. The housing 122 defines, among other things, a fuse receptacle 124 that receives the overcurrent protection fuse 82. Unlike the fuse blocks 52 described above, the fuse receptacle 124 in the fuse holder housing 122 is enclosed in the housing 122, and a cap 126 is provided to close the end of the fuse receptacle 124 through which the fuse 82 can be inserted or removed along an insertion axis 128.

The fuse 82 as shown is vertically oriented in the fuse holder housing 122, and the fuse receptacle 82 is provided with line and load-side fuse contact members that, in turn, are electrically connected to line and load-side terminals 130, 132. Optionally, a set of switch contacts 134 and a rotary switch actuator 136 are provided, with the switch contacts 134 providing for connection and disconnection of a circuit path, responsive to a position of the switch actuator 136, between the line-side terminal 130 and the fuse 182. When the switch contacts 134 are closed and when the fuse 82 is present and has not yet opened (i.e., the fusible element is in an intact, current carrying condition) electrical current may flow through the fuse holder 120 between the line and load side-terminals 130, 132 and through the fuse 82. When the switch contacts 134 are opened, an open circuit is established in the fuse holder 120 between the line-side terminal 130 and the fuse 82. The fuse 82 provides overcurrent protection via operation of the fusible element when the switch contacts 130 are closed. The embodiment depicted in FIG. 12 as described thus far may generally be recognized as a Compact Circuit Protector Base (CCPB) device available from Bussmann by Eaton of St. Louis Mo.

To address electrical arcing issues associated with higher system voltage of 1000 VDC or 1500 VDC, the magnetic arc suppression system 90 including the permanent magnet 92 according to the present invention is provided in the fuse holder 120. In the example of FIG. 12, the magnetic arc suppression system 90 includes a single permanent magnet 92 that applies a magnetic field B across the fuse 82 in the fuse receptacle 124 to deflect the electrical arc inside the fuse 82 as the fusible element therein operates. In the position and orientation shown, the permanent magnet 92 extends generally perpendicular to a major side surface of the housing 122 and accordingly establishes a magnetic field B extending parallel to the major side surface of the housing 122 within the fuse receptacle 124. The magnetic field B extends transversely across the fuse receptacle 124 in a direction generally perpendicular to the fuse insertion axis 128. A force F is generated in response to the magnetic field B and the current I flowing through the fuse 82 to influence electrical arcing conditions as described above and specifically illustrated in the examples below.

While a single magnet 92 is shown in the embodiment of FIG. 12 in the arc suppression system 90, more than one magnet may be provided and magnets may be placed in positions other than that shown while producing otherwise similar effects. Any of the magnetic arrangements shown in FIGS. 2, 4, 5 and 6 may be accomplished in the fuse holder 120 and the magnets utilized may be coupled to the fuse holder 120 in any desired location or orientation to produce the intended magnetic field arc suppression and effect.

Also, in contemplated embodiments the switch contacts 134 and the switch actuator 136 may be omitted and the fuse holder may be provided in modular form without switching capability. The modules may be ganged together to provide multiple pole fuse holders, or alternative, the housing may define multiple fuse receptacles 124 and contact terminals to accommodate a plurality of fuses 82. In accordance with known modular fuse holders, the fuse holder 120 in such scenarios may include a fuse insertion drawer or other alternative means of accepting the fuse in the fuse receptacle. Various adaptations are possible to provide numerous types of fuse holders having embedded magnetic arc suppression systems to facilitate fusible circuit protection of circuitry operating at a system voltage of 1000 VDC or 1500 VDC.

Figure 13:
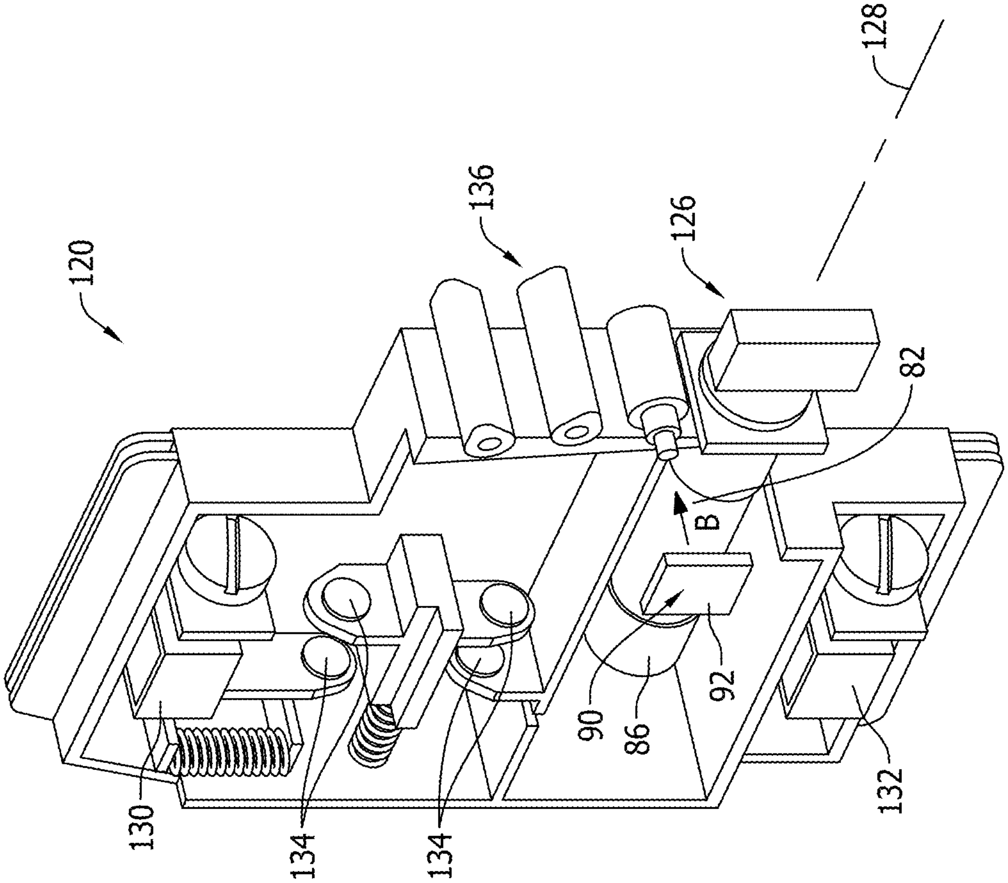
FIG. 13 is a perspective view of a second embodiment of an exemplary fuse holder including a magnetic arc suppression system according to the present invention.

FIG. 13 is a perspective view of another embodiment of the fuse holder 120 that is similar in most aspects to the fuse holder shown in FIG. 12, but includes a differently configured magnetic arc suppression system 90 according to the present invention.

To address electrical arcing issues associated with higher system voltage of 1000 VDC or 1500 VDC, the magnetic arc suppression system 90 including the permanent magnet 92 according to the present invention is provided. Comparing FIGS. 12 and 13, in the fuse holder 120 of FIG. 13 the single permanent magnet 92 is moved 90° from its position shown in FIG. 12. As such, in the position and orientation shown in FIG. 13, the permanent magnet 92 extends generally parallel to the major side surface of the housing 122 and accordingly establishes a magnetic field B extending perpendicular to the major side surface of the housing 122 within the fuse receptacle 124. The magnetic field B extends transversely across the fuse receptacle 124 in a direction generally perpendicular to the fuse insertion axis 128. A force F is generated in response to the magnetic field B and the current I flowing through the fuse 82 to influence electrical arcing conditions as described above and specifically illustrated in the examples below. Additional magnets and orientations of magnets may also be provided to establish magnetic fields in still other directions and with varying intensity.

Figure 14:
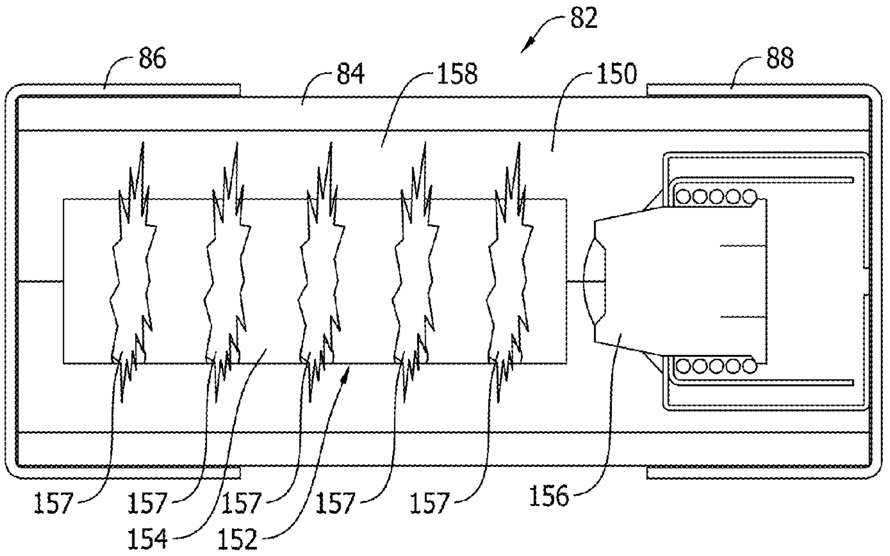
FIG. 14 is a sectional view of an exemplary overcurrent protection fuse in a short circuit operating condition wherein electrical arcing has commenced.

FIG. 14 is a sectional view of the overcurrent protection fuse 82 showing an exemplary internal construction. The fuse housing 84 defines an internal bore or passageway that accommodates a fuse element assembly 152 that is connected to the conductive end caps or ferrules 86, 88 at each opposing end of the fuse housing 84. In the example shown, the fuse element assembly 152 includes a short circuit element 154 and an overload element 156 connected to one another in series and in combination establishing a current path between the conductive end caps or ferrules 86, 88. The construction and operation of the short circuit element 154 and an overload element 156 is conventional, but enhanced by the magnetic arc suppression system in the fuse blocks of fuse holders described above.

The short circuit element 154 is fabricated from a strip of electrically conductive material and is provided with a number of openings formed therethrough. In between the openings are areas of reduced cross sectional area, referred to in the art as “weak spots”, that are subject to increased amounts of heat in a short circuit current condition. As such, the short circuit element 154 begins to melt and disintegrate at the location of the weak spots when subject to a short circuit current condition. FIG. 14 illustrates a number of electrical arcs 157 occurring at the locations of the weak spots in a short circuit operating condition. To suppress the electrical arcs 157 the fuse housing 150 may be filled with an arc extinguishing media 158 such as silica sand. The arc extinguishing 158 media immediately surrounding the location of the arcs 157 absorbs the arc energy via heat dissipation. Such techniques have been generally effective for fuse operation at system voltages of up to 600 VDC, but is problematic at higher system voltages of 1000 VDC or 1500 VDC. The cooling of the arcs 157 at higher system voltage is not strong enough to dissipate energy of an arc voltage higher than the source voltage such as 1000 VDC or 1500 VDC with a conventional fuse and fuse holder or conventional fuse and fuse block.

Figure 15:
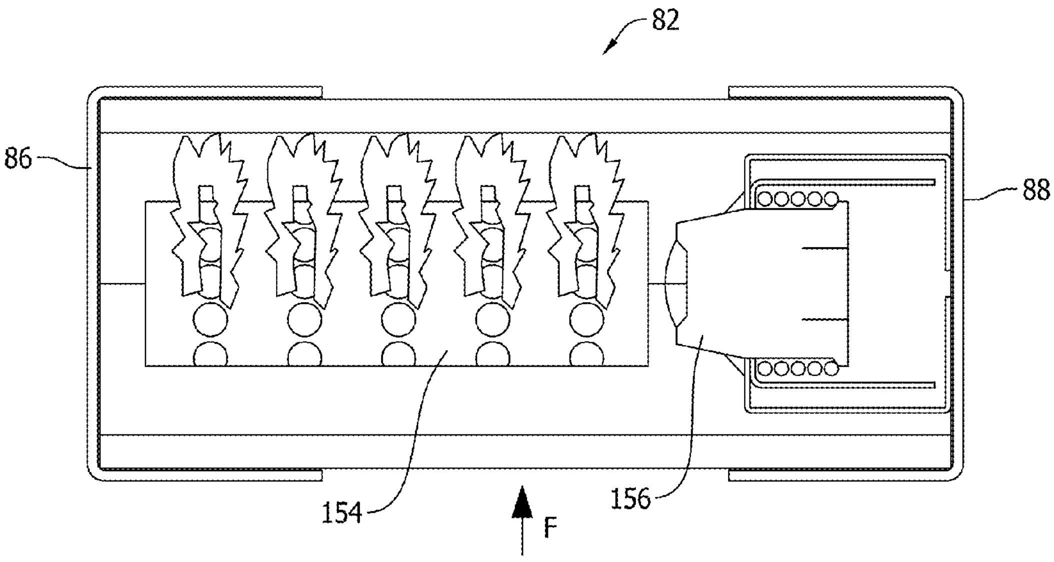
FIG. 15 is a view similar to FIG. 14 but illustrating an arc cooling effect inside the fuse produced by a magnetic arc suppression system according to the present invention.

FIG. 15 illustrates an arc cooling effect produced in the same fuse 82 by the magnetic arc suppression system 90 described above. In FIG. 15, the magnetic arc suppression system 90 applies a magnetic field B extending out of the page in the drawing of FIG. 15. When current I flows through the fuse element assembly 152 from the end cap 86 to the end cap 88 (i.e., from left to right in FIG. 15), the force F is applied laterally, radially or diametrically across the fuse and fuse element in the direction shown. When the electrical arcs 157 (FIG. 14) have commenced, the force F drives and stretches the arcs 157 into the arc extinguishing media 158 farther away from the short circuit element 154 wherein the arc extinguishing media 158 is relatively cooler than the arc extinguishing media 158 immediately surrounding the short circuit element 154. Heat is more readily dissipated by the relatively cooler arc extinguishing media 158, which leads to an arc voltage higher than the source voltage, and the arc can be more readily and easily extinguished. The cooling effect is shown in FIG. 15 wherein the arcs are effectively shifted upward inside the fuse 82. The magnetic arc deflection greatly improves the interrupting capability of the fuse 82, without affecting the construction of the fuse 82 and its form factor. Instead, the arc suppression magnet (or magnets) are applied to the fuse holder or fuse block at relatively low cost, without increasing the form factor of the fuse holder or the fuse block.

While the exemplary overcurrent protection fuse 82 described above includes an arc quenching media such as silica sand, it is recognized that another known arc quenching media may be utilized inside the fuse for similar purposes, including but not limited compositions or compounds that generate an arc extinguishing gas. In contemplated embodiments of this type, the composition may be applied, for example, on the interior surface of the fuse housing 84 and the short circuit fuse element 154 may be surrounded by air. The force F may be generated by the permanent magnet(s) of the arc suppression system to stretch and deflect the electrical arc across the air until it reaches the composition that, in turn, releases the arc extinguishing gas. The release of the gas enables the cooling of the arc, increases the pressure inside the fuse housing 84 and helps to compress ionized gas associated with the electrical arcs. The increased pressure also quickly drives the fault current to zero so that the arcs cease to exist. As one non-limiting example of this type, an arc extinguishing composition such as melamine and its related compounds may be utilized to fill the interior of the fuse housing 84 with arc extinguishing gas and suppress the electrical arc with reduced intensity in combination with the magnetic arc suppression system described.

In still other embodiments, the fuse housing 84 may be filled with air in the absence of an arc extinguishing compound. The magnetic arc suppression system still applies the force F that stretches and deflects the arc farther away from the short circuit fuse element 154 into the air inside the fuse housing 102 to increase arc voltage and reduce arc interruption duration. In certain embodiments of this type, the arcs could reach the interior wall of the fuse housing 82 and the relatively cooler wall could aid in dissipating arc energy. Care should be taken, however, to ensure that the arc energy does not penetrate the wall of the fuse housing 84.

Figure 16:
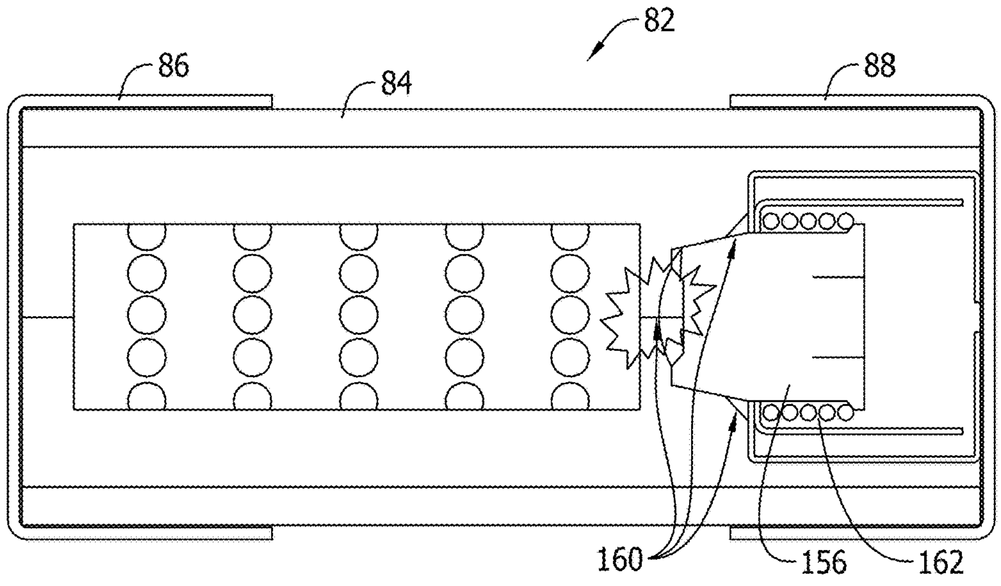
FIG. 16 is another sectional view of an overcurrent protection fuse shown in FIG. 13 in an overload operating condition wherein electrical arcing has commenced.

FIG. 16 is a sectional view of the overcurrent protection fuse 82 illustrating an operation of the overload element 156 in an overload operating condition wherein electrical arcing has commenced. In the example illustrated, the overload element 156 includes three soldered connections in the locations 160. Heating of the solder in an electrical overload conditions weakens the soldered connections, and the spring element 162 eventually forces release of the overload fuse element 156 and physically severs its connection to the short circuit fuse element 154 and breaks the electrical connection through the fuse 82 between the end caps 86, 88. As seen in FIG. 16, as the mechanical and electrical connection between the overload element 156 and the short circuit element 154 is broken, an electrical arc commences between the ends of the short circuit element 154 and the overload element 156. The spring-loaded overload element 156 is pushed away from the end of the short circuit element 154 as this occurs, eventually extending the arc length enough so the arc can no longer be sustained, but at high system voltage (e.g. 1000 VDC or 1500 VDC), the arc voltage may not be high enough and is still problematic.

Figure 17:
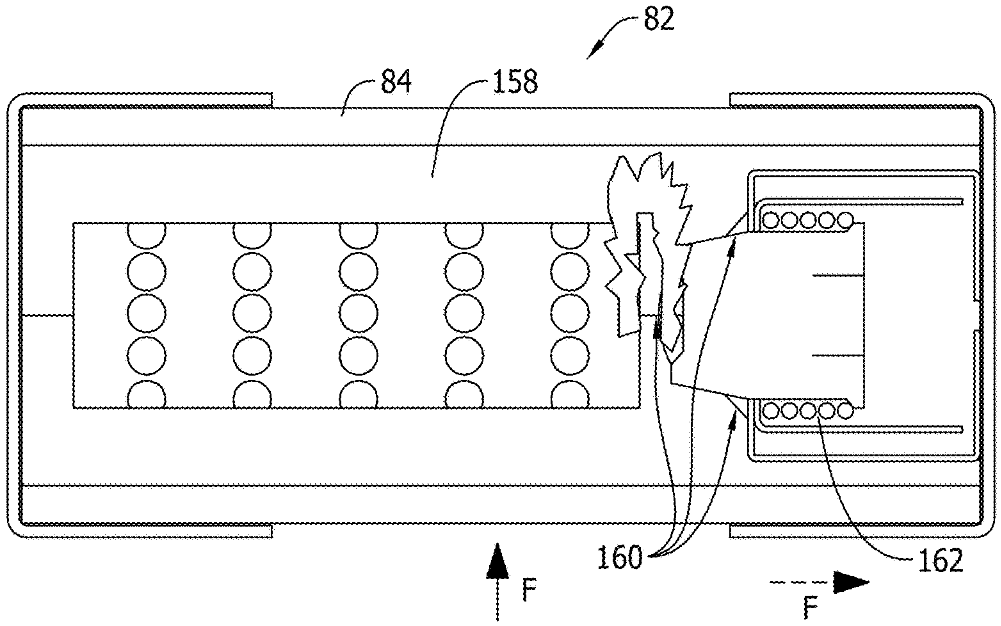
FIG. 17 is a view similar to FIG. 16 but illustrating an arc cooling effect inside the fuse produced by a magnetic arc suppression system according to the present invention.

To address arc interruption issues associated with higher system voltage as the fuse 82 operates, FIG. 17 illustrates an arc cooling effect produced by the magnetic arc suppression system according to the present invention. As seen in FIG. 17, the force F generated by the permanent magnet(s) in the fuse holder or fuse block stretches the arc farther away from the initial location where the arc started and therefore the arc contacts a cooler portion of the arc extinguishing media 158 than it otherwise would to more quickly dissipate arc energy via heat transfer. The other arc extinguishing media techniques described above may likewise alternatively be utilized in combination with the magnetic arc suppression as desired to address overload current operation of the fuse 82.

It is contemplated that in some embodiments wherein overload current protection is the primary concern of the fusible circuit protection, the magnetic arc suppression system could be configured to generate a force F (shown in phantom in FIG. 17) that is directed longitudinally instead of radially as in the previously described examples. That is, the magnetic field may be established so as to provide the force F extending in a direction parallel to the longitudinal axis of the fuse instead of transversely across the fuse. A longitudinally directed force F may assist in the disconnection of the overload element 156 and/or its movement away from the short circuit fuse element 154. Such an improved disconnection force via the combination of the force F produced by the magnet(s) and the bias force of the spring element 162 would facilitate a reduction in arc duration as the overload element 156 operates.

Figure 18:
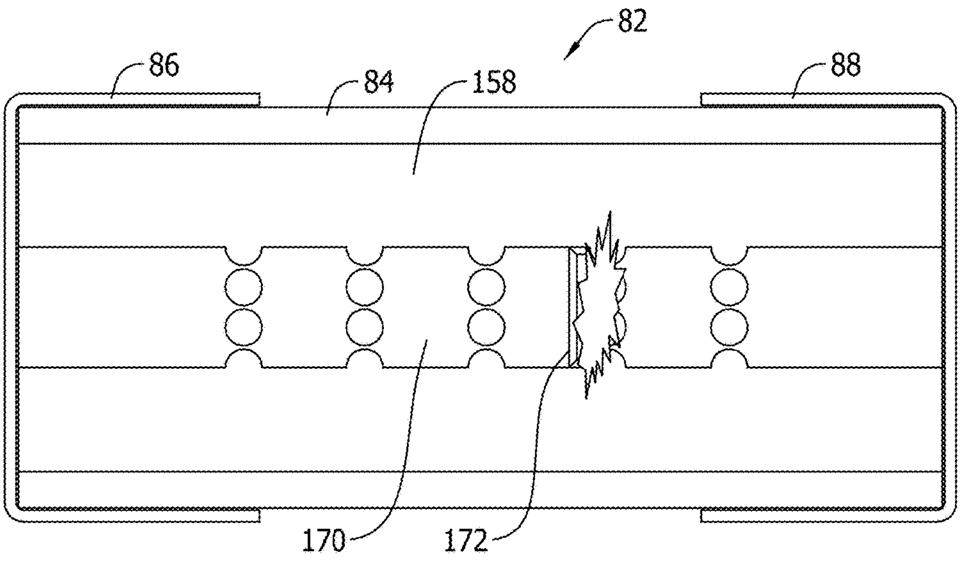
FIG. 18 is a sectional view of another overcurrent protection fuse in an overload operating condition wherein electrical arcing has commenced.

FIG. 18 is a sectional view of a fuse 82 including another alternative overcurrent protection fuse element 170 connected between the fuse end caps 86 and 88. As shown the fuse element 170 may be configured as a strip of conductive material having a number of openings formed therethrough that define weak spots as discussed above. A portion of the overload fuse element 170, however, includes a Metcalf effect (M-effect) coating 172 where pure tin (Sn) is applied to the fuse element 170, fabricated from copper in this example, proximate selected ones of the weak spots in the fuse element 170 as shown. During overload heating the Sn and Cu diffuse together in an attempt to form a eutectic material. The result is a lower melting temperature somewhere between that of Cu and Sn or about 600° C. in contemplated embodiments. The overload fuse element 170 and in particular the portion or section thereof including the M-effect coating 172 will therefore respond to overload current conditions that will not affect the remainder of the fuse element 170. As the fuse element begins to open at the location of the M-effect coating 172, an electrical arc commences inside the fuse housing 84. At higher system voltage (e.g. 1000 VDC or 1500 VDC), the arc extinguishing media 158 may itself not be sufficient to contain or dissipate the arc energy quick enough to generate an arc voltage higher than the system voltage for successful circuit interruption.

Figure 19:
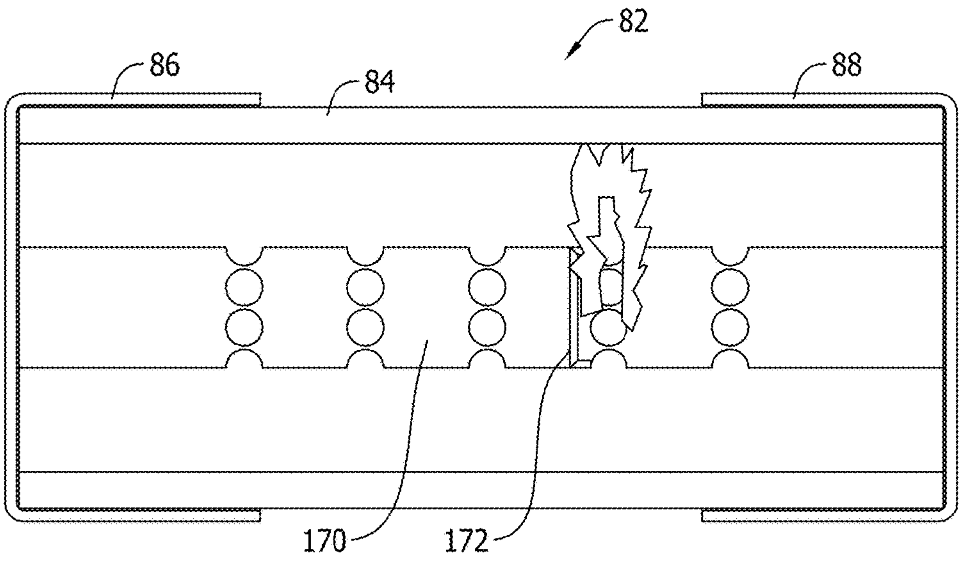
FIG. 19 is a view similar to FIG. 18 but illustrating an arc cooling effect inside the fuse produced by a magnetic arc suppression system according to the present invention.

To address arc energy issues associated with higher system voltage as the fuse 82 operates, FIG. 19 illustrates an arc cooling effect produced by the magnetic arc suppression system according to the present invention. As seen in FIG. 19, the force F generated by the permanent magnet(s) in the fuse holder or fuse block stretches the arc farther away from the fuse element 170 and therefore the arc contacts a cooler portion of the arc extinguishing media 158 than it otherwise would to more quickly dissipate arc energy via heat transfer. The other arc extinguishing media techniques described above may likewise alternatively be utilized in combination with the magnetic arc suppression as desired to address overload current operation of the fuse 82.

While exemplary fuses and fuse elements have been described in relation to the fuse blocks and fuse holders of the present invention, still other types of fuses and fuse elements are possible and likewise may be utilized. Various types of alternative fuses and fuse elements are known and not described in detail herein, any of which would benefit from the magnetic arc suppression techniques described for similar reasons to those described above.

Also, while the embedded magnet arc suppression system is described in relation to exemplary fuse blocks and fuse holders, the magnetic arc suppression is not necessarily limited to the embodiments described and illustrated. The benefits of the magnetic arc suppression more broadly apply to fuse assembles other than those specifically described herein.

Finally, while the present invention has been described in the context of particular applications for higher voltage DC system voltage and circuitry, the invention is not limited to the particular application and voltage ranges described. The magnetic arc suppression system may be advantageously utilized in wider range of applications and system voltages, and accordingly the exemplary applications and system voltages referred to herein are set forth for purposed of illustration rather than limitation.

The benefits and advantages of the inventive concepts disclosed herein are now believed to have amply demonstrated in relation to the exemplary embodiments disclosed.

An embodiment of a fuse assembly has been disclosed including: a nonconductive housing defining at least one fuse receptacle dimensioned to receive an overcurrent protection fuse; at least one set of fuse contact terminals configured to establish electrical connection through the overcurrent protection fuse when received in the at least one fuse receptacle; and at least one permanent magnet coupled to the nonconductive housing and imposing a magnetic field in the fuse receptacle; wherein at least a portion of the overcurrent protection fuse is disposed in the magnetic field when received in the fuse receptacle.

Optionally, the at least one permanent magnet may include a first permanent magnet and a second permanent magnet spaced apart from the first magnet, the magnetic field being established between the first permanent magnet and the second permanent magnet. The first permanent magnet and the second permanent magnet may be situated on opposing sides of the fuse receptacle and at least a portion of the overcurrent protection fuse may be disposed between the first magnet and the second magnet when the overcurrent protection fuse is received in the fuse receptacle. The fuse assembly may further include a ferromagnetic plate proximate the first permanent magnet and the second permanent magnet. The ferromagnetic plate may be U-shaped.

Also optionally, the at least one permanent magnet may be substantially covered by the overcurrent protection fuse when the overcurrent protection fuse is received in the fuse receptacle. The fuse assembly may further include a ferromagnetic plate proximate the at least one permanent magnet. The ferromagnetic plate may be U-shaped.

The overcurrent protection fuse is received in the fuse receptacle along an insertion axis, with the at least one magnet imposing a magnetic field extending perpendicular to the insertion axis. The assembly may further include at least one switch contact provided in the nonconductive housing. The nonconductive housing includes a major side wall, with the at least one magnet extending parallel to the major side wall. Alternatively, the at least one magnet may extend perpendicular to the major side wall.

The overcurrent protection fuse may be enclosed in the at least one fuse receptacle. The nonconductive housing may be configured as an open style fuse block. The nonconductive housing may also be configured as a fuse holder. The fuse assembly may include a cap covering an end of the fuse receptacle.

The magnetic field may be oriented inside the fuse receptacle to provide one of a radial arc deflecting force and an axial arc deflecting force acting upon the overcurrent protection fuse when the overcurrent protection fuse is received in the fuse receptacle.

The first and second fuse contact terminals may include resilient spring clips. The resilient spring clips may be configured to receive respective end caps of the overcurrent protection fuse.

The fuse assembly may be in combination with the overcurrent protection fuse. The overcurrent protection fuse may include at least one of a short circuit fuse element and an overload fuse element.

An embodiment of a fuse assembly has also been disclosed including: a nonconductive housing defining at least one elongated fuse receptacle dimensioned to receive a cylindrical overcurrent protection fuse including opposing end caps and at least one fusible element; at least one set of fuse contact terminals configured to establish electrical connection through the opposing end caps and the at least one fusible element when received in the at least one fusible element; and at least one permanent magnet coupled to the nonconductive housing and imposing a magnetic field in the fuse receptacle and across the at least one fusible element.

Optionally, the elongated fuse receptacle is defined by opposing side walls, and the magnetic field may be oriented perpendicular to the opposing side walls. The elongated fuse receptacle is defined by opposing side walls, and the magnetic field is oriented parallel to the opposing side walls. The fuse assembly may also include at least one ferromagnetic plate proximate the at least one magnet. The magnetic field may be oriented in one of an axial direction and a radial direction relative to the cylindrical fuse. The nonconductive housing may define one of an open style fuse block and a fuse holder. The at least one permanent magnet may include a first permanent magnet and a second permanent magnet, the magnetic field imposed between the first magnet and the second magnet.

Another embodiment of a fuse assembly has also been disclosed including: a nonconductive housing defining at least one a fuse block and a fuse holder, the nonconductive housing including at least one pair of opposed side walls defining at least one elongated fuse receptacle therebetween, the at least one fuse receptacle dimensioned to receive a cylindrical overcurrent protection fuse including opposing end caps and at least one fusible element; at least one set of resilient fuse clips configured to receive the opposing end caps and establish electrical connection through the least one fusible element when received in the at least one fusible element; and at least one permanent magnet located in the fuse receptacle and imposing an external magnetic field across the at least one fusible element, whereby current flowing through the at least one fuse element and through the external magnetic field produces a mechanical arc deflection force when the at least one fuse element operates to interrupt the circuit connection; and wherein the mechanical arc deflection force is oriented in one of a radial direction relative to the cylindrical fuse and a longitudinal direction relative to the fuse.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit protection device for an electrical power system, the circuit protection device comprising:

a nonconductive housing defining at least one fuse receptacle to receive a fuse housing containing at least one fuse element; and a magnetic arc suppression system operative across the at least one fuse receptacle to provide an arc cooling effect inside the fuse housing during an opening of the at least one fuse element while the fuse housing is received in the at least one fuse receptacle.

2. The circuit protection device of claim 1, further comprising a first fuse clip and a second fuse clip in the at least one fuse receptacle.

3. The circuit protection device of claim 1, wherein the at least one fuse receptacle has a longitudinal axis, and wherein the magnetic arc suppression system imposes a magnetic field extending in a direction parallel to the longitudinal axis.

4. The circuit protection device of claim 1, wherein the at least one fuse receptacle has a longitudinal axis, and wherein the magnetic arc suppression system imposes a magnetic field extending in a direction perpendicular to the longitudinal axis.

5. The circuit protection device of claim 1, wherein the at least one fuse element includes a short circuit element and an overload element, and wherein the magnetic arc suppression system is operative to provide the arc cooling effect across the short circuit element and across the overload element.

6. The circuit protection device of claim 1, wherein the magnetic arc suppression system is operative to provide an arc cooling effect sufficient to cool electrical arcing inside the fuse housing when the overcurrent protection fuse opens under an operating voltage up to 1000 VDC.

7. The circuit protection device of claim 6, wherein the magnetic arc suppression system is operative to provide an arc cooling effect sufficient to cool electrical arcing inside the fuse housing when the overcurrent protection fuse opens under an operating voltage up to 1500 VDC.

8. The circuit protection device of claim 1, wherein the magnetic arc suppression system is substantially covered by the fuse housing when the fuse housing is received in the at least one fuse receptacle.

9. The circuit protection device of claim 1, wherein the magnetic arc suppression system comprises a ferromagnetic plate.

10. The circuit protection device of claim 9, wherein the ferromagnetic plate is U-shaped.

11. The circuit protection device of claim 1, wherein the nonconductive housing is configured as an open style fuse block having a plurality of fuse receptacles, and the magnetic arc suppression system imposing a magnetic field in multiple ones of the plurality of fuse receptacles.

12. The circuit protection device of claim 11, wherein the magnetic arc suppression system includes a plurality of permanent magnets, and at least one of the plurality of permanent magnets is mutually shared by first and second ones of the plurality of fuse receptacles to establish a magnetic field in each of the first and second ones of the plurality of fuse receptacles.

13. The circuit protection device of claim 1, further comprising a movable switch contact provided in the nonconductive housing to connect or disconnect a circuit path in the nonconductive housing and through the at least one fuse element.

14. A circuit protection device of comprising:

a nonconductive housing defining at least one fuse receptacle; and a magnetic arc suppression system operative across the at least one fuse receptacle to provide an arc cooling effect inside of an overcurrent protection fuse in the at least one fuse receptacle, wherein the magnetic arc suppression system includes at least one magnet and at least one ferromagnetic plate.

15. The circuit protection device of claim 14, wherein the magnetic arc suppression system is operative to provide an arc cooling effect sufficient to cool electrical arcing when the overcurrent protection fuse opens under an operating voltage greater than 600VDC.

16. The circuit protection device of claim 15, wherein the magnetic arc suppression system is operative to provide an arc cooling effect sufficient to cool electrical arcing when the overcurrent protection fuse opens under an operating voltage of 1000 VDC.

17. The circuit protection device of claim 16, wherein the magnetic arc suppression system operative is operative to provide an arc cooling effect sufficient to cool electrical arcing when the overcurrent protection fuse opens under an operating voltage of 1500 VDC.

18. The circuit protection device of claim 14, wherein the nonconductive housing defines an open style fuse block.

19. The circuit protection device of claim 14, wherein the at least one ferromagnetic plate is U-shaped.

20. A circuit protection device comprising:

a nonconductive housing defining a fuse block or a fuse holder, the nonconductive housing including at least one pair of opposed side walls defining at least one fuse receptacle therebetween, the at least one fuse receptacle dimensioned to receive an overcurrent protection fuse including a fuse element assembly; and a magnetic arc suppression system operative across the at least one fuse receptacle to provide an arc cooling effect inside the overcurrent protection fuse during an opening of the fuse element assembly while the overcurrent protection fuse is in the fuse receptacle;

wherein the magnetic arc suppression system includes at least one magnet and at least one ferromagnetic plate; and wherein the arc cooling effect provided is sufficient to cool electrical arcing when the overcurrent protection fuse opens under an operating voltage of at least about 1000 VDC.

* * * * *